(12) United States Patent
Nanba

(10) Patent No.: US 6,430,092 B2
(45) Date of Patent: Aug. 6, 2002

(54) MEMORY DEVICE WITH BOOTING CIRCUIT CAPABLE OF PRE-BOOTING BEFORE WORDLINE SELECTION

(75) Inventor: Yasuhiro Nanba, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/834,402

(22) Filed: Apr. 13, 2001

(30) Foreign Application Priority Data

Apr. 13, 2000 (JP) .......................................... 2000-11209

(51) Int. Cl.[7] ................................................ G11C 7/00
(52) U.S. Cl. .............................. 365/189.11; 365/189.09; 365/189.05
(58) Field of Search ........................ 365/189.11, 189.05, 365/189.09, 230.06, 230.08, 233

(56) References Cited

U.S. PATENT DOCUMENTS 5,801,997 A * 9/1998 Hsieh et al. ........... 365/189.11

* cited by examiner

Primary Examiner—David Nelms
Assistant Examiner—David Lam
(74) Attorney, Agent, or Firm—Michael Best & Friedrich LLC; Laff, Whitesel & Saret, Ltd.; J. Warren Whitesel

(57) ABSTRACT

When a /RAS (/row address strobe) signal is input to a memory device, a control logic of the memory device issues an internal /RAS signal corresponding to the /RAS signal and then a row decoder drives a selected wordline in response to the internal /RAS signal. A predetermined time internal passes from the issuance of the internal /RAS signal to the drive of the selected wordline, depending upon a circuit layout of the memory device, skew and so forth. The predetermined time interval is utilized for a time of pre-booting at a booting circuit.

8 Claims, 4 Drawing Sheets

MEMORY DEVICE WITH BOOTING CIRCUIT CAPABLE OF PRE-BOOTING BEFORE WORDLINE SELECTION

BACKGROUND OF THE INVENTION

This invention relates generally to memory devices, and more particularly to a method and apparatus for reducing the access time necessary to read data out of a memory device, such as a dynamic random access memory (DRAM) device, a synchronous DRAM (SDRAM) device, or the like.

In a recent memory device, a power supply voltage $V_{CC}$ becomes lower to, for example, 3.3 V. A row decoder needs to use a voltage, which has a higher level than the threshold level $V_{th}$ of the storage cell, on driving a selected wordline. The higher level voltage is referred to as "a selection level voltage" and belongs to a range, for example, between 4 V and 5 V.

In order to supply the row decoder with the higher level voltage, DRAM devices or SDRAM devices commonly use a booting circuit that can produce a booted or boosted voltage which has a voltage level higher than a power supply voltage $V_{CC}$.

However, the booted voltage declines in voltage level when the row decoder drives the selected wordline, because the booted voltage is temporally consumed in driving the selected wordline. The temporal consumption of the booted voltage may result in that the booted voltage falls below the selection level voltage, and that the drive of the wordline is unstable. To ensure the readout operation, it is necessary that the booted voltage recovers its level and reaches the selection level voltage. Hence, the memory access time for the stable readout operation is often excessive in previously developed memory device.

SUMMARY OF THE INVENTION

It is therefore an object of the present invention to provide an improved memory device which can reduce the memory access time in comparison with the previously developed memory device.

Generally, when a /RAS (/ row address strobe) signal is input to a memory device, a control logic of the memory device issues an internal /RAS signal corresponding to the /RAS signal and then a row decoder drives a selected wordline in response to the internal /RAS signal. It is noted here that a predetermined time internal passes from the issue of the internal /RAS signal to the drive of the selected wordline, depending upon a circuit layout of the memory device, skew and so forth. One aspect of the present invention utilizes the predetermined time interval for a time of pre-booting at a booting circuit.

According to one aspect of the present invention, a memory device includes a memory cell array, a control logic, a booting circuit, and a row decoder. The memory cell array comprises storage cells organized and connected to wordlines and bitlines in rows and columns. The control logic issues an internal /RAS signal in response to a /RAS signal input to the memory device.

The booting circuit is coupled to the control logic and the row decoder. The booting circuit produces as a booted voltage signal a voltage which is booted to a selection level voltage in normal and which is further booted above the selection level voltage when the internal /RAS signal starts to turn on. Herein, the selection level voltage is a voltage necessary to drive the wordline. The booted voltage signal is delivered to the row decoder from the booting circuit.

The row decoder is coupled to the control logic and connected to the wordlines. The row decoder starts to drive a selected one of the wordlines with the booted voltage signal when a predetermined time interval passes since the internal /RAS signal starts to turn on. For example, the predetermined time interval depends on a circuit layout of the memory device.

With the above structure, the booted voltage is further booted above the selection level voltage before the row decoder drives the selected wordline. Even if the booted voltage signal declines in voltage level when being temporally consumed in driving the selected wordline, the probability that the booted voltage signal falls below the selection level voltage is decreased. In addition, if falling below the selection level voltage, the booted voltage signal can recover its level and can reach the selection level voltage with a shorter time. Therefore, the memory access time for the stable readout operation is reduced in the memory device according to one aspect of the present invention.

These and other aspects of the present invention, as well as its advantages and features are described as preferred embodiments in more detail in conjunction with the text below and attached figures.

DESCRIPTION OF THE PREFERRED EMBODIMENTS

Figure 1:
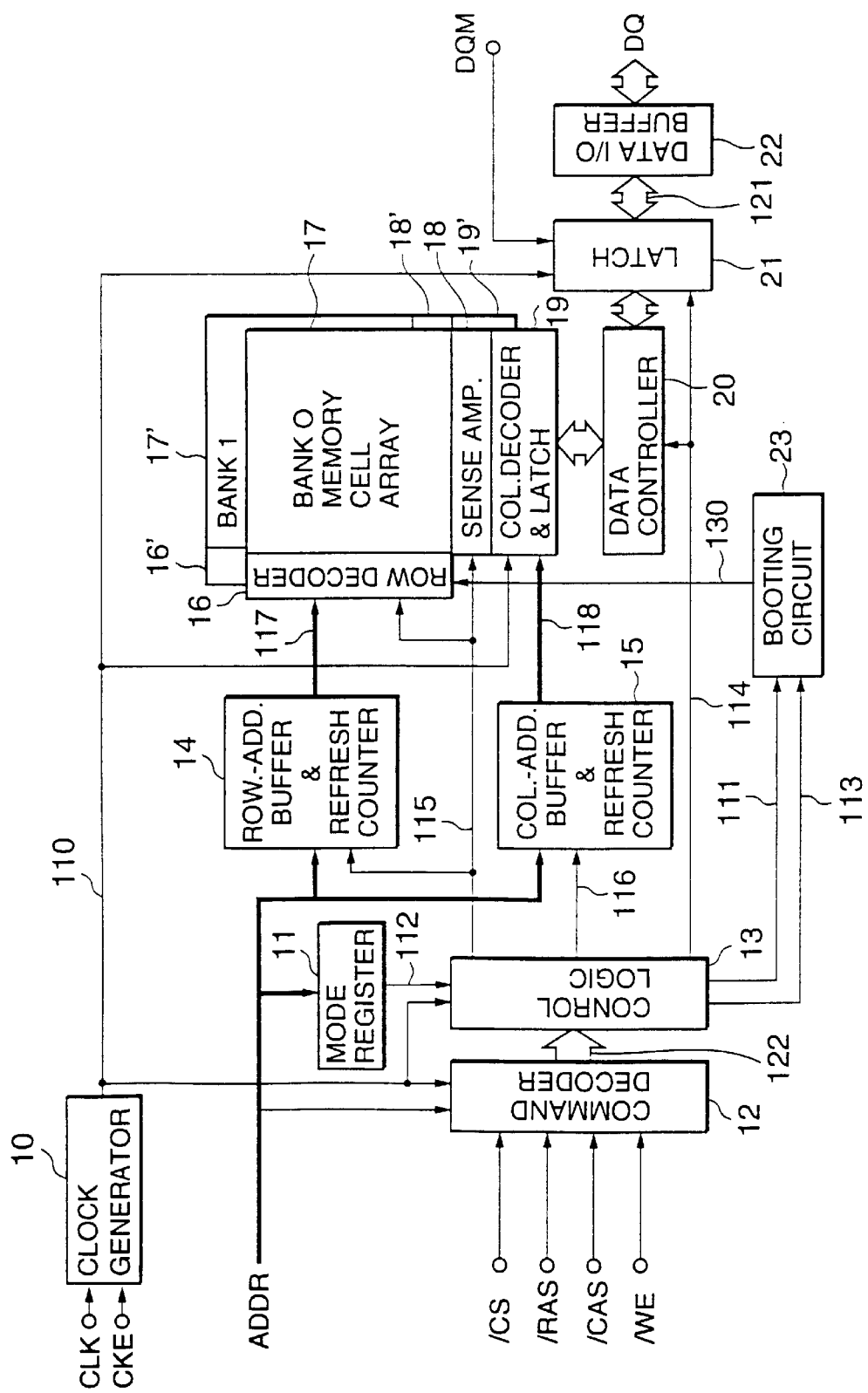
FIG. 1 is a block diagram of a SDRAM in accordance with one embodiment of the present invention.

As illustrated in FIG. 1, a SDRAM according to one embodiment of the present invention includes a bank 0 memory cell array 17 and of bank 1 memory cell array 17' which both comprise storage cells organized and connected to wordlines and bitlines in rows and columns.

Power is supplied to the SDRAM 20 pins $V_{CC}$ (not shown). In this embodiment, power supply voltage is 3.3 V. A system clock (CLK) signal is provided through a CLK input pin and a clock enable signal (CKE) is provided through a CKE input pin to a clock generator 10 of the SDRAM. The clock generator 10 activates and deactivates the CLK signal based on the state of the CKE signal, and produces the activated CLK signal as an internal clock signal 110. In the SDRAM, all the input and output signals, with the exception of the CKE input signal during power down and self refresh modes, are synchronized to the active going edge of the CLK signal, namely, the internal CLK signal 110. In this embodiment, the internal CLK signal 110 is supplied to a command decoder 12, a control logic 13, a column decoder & latch (merely referred to as a column decoder hereinafter) 19, 19' and a latch 21.

A chip select (/CS) input pin inputs a /CS signal which enables the command decoder 12 when being low, and disables the command decoder 12 when being high. The command decoder 12 further receives control signals including a /RAS signal on a /RAS pin, a column address strobe (/CAS) signal on a /CAS pin, and a write enable (/WE)

signal on a /WE pin. The command decoder 12 decodes the /RAS, /CAS, and /WE signals into command signals 122 which puts the control logic 13 in a particular command operation sequence as described later.

Address signal (A0–A10) and bank select signal (A11) are provided on address pins which are collectively shown as "ADDR" in FIG. 1. Both the row and column address input bits are provided on the address pins ADDR. During write transfer operations, data are input into the SDRAM through data input/output pins which are collectively shown as "DQ" in FIG. 1. During read transfer operations, data are read out of the SDRAM through the data input/output pins DQ. An input/output mask signal is provided on a DQM input pin to provide non-persistent buffer control for a data input/output buffer 22.

A mode register 11 produces a mode register signal 112 in response to address signal. The mode register signal 112 indicates a read latency (or CAS latency) and a burst length.

The control logic 13 issues internal command signals to control the various circuitry of the SDRAM based on the commands decoded by the command decoder 12. In this embodiment, ones of the internal command signals 111 and 113 are delivered into a booting circuit 23, which are referred to as an internal /RAS signal and a sense enable end signal, respectively. The internal /RAS signal 111 corresponds to the /RAS signal received on the /RAS pin, and is in ON state when being low. The sense enable end signal 113 indicates a sufficient amplifying is executed at a sense amplifier 18, 18', when the sense enable end signal takes high level and is in ON state. Thus, the sense enable end signal 113, used in a normal DRAM device, is applied to the SDRAM according to this embodiment. The internal command signal 114 is delivered into a data controller 20 and the latch 21 to control the column drive operation. The internal command signal 115 is delivered into a row address buffer & refresh counter (merely referred to as a row address buffer hereinafter) 14 row decoders 16, 16', and sense amplifier 18, 18' to control the row drive operation. The internal command signal 115 includes the internal /RAS signal in this embodiment. The internal command signal 116 is delivered to the column address buffer 15 to control the column drive operation, especially, the column address buffering and refreshing.

For example, a valid ACTIVE command is initiated by the command decoder 12 when the /CS and /RAS signals are low and the /CAS and /WE signals are high on a rising edge of the internal CLK signal 110. The control logic 13 produces the internal command signals (including the internal /RAS signal) corresponding to the valid ACTIVE command. During the ACTIVE command, the state of the bank select signal determines which bank memory cell array to activate and address. During the ACTIVE command, a row address of the selected bank memory cell array is buffered in the row address buffer 14. The row address is provided to the row decoder 16 of the bank 0 memory cell array 17 or the row decoder 16' coupled to the bank 1 memory cell array 17', depending on the state of the bank select signal. The row decoder 16 decodes the row address provided from the row address buffers 14, and drives or activates one of the wordlines of the bank 0 memory cell array 17 with a booted voltage signal 130, in correspondence with the row address for read or write transfer operations. The row decoder 16' similarly decodes the row address in row address buffer 14 to drive or activate one of the wordlines of the bank 1 memory cell array 17' with the booted voltage signal 130, in correspondence with the row address for read or write transfer operations.

A valid READ command is initiated by the command decoder 12 when the /CS, /RAS and /WE signals are low, and when the /CAS signal is high on a rising edge of the CLK signal. The control logic 13 produces the internal command signals (including the internal /RAS signal) corresponding to the valid READ command. The internal command signal corresponding to the READ command controls the column address buffer 15 which receives column address bits and buffers a column address of the bank memory cell array selected by the bank select signal at the time when the internal command signal 116 corresponding to the READ command is issued by the control logic 13.

A column decoder & latch (merely referred to as column decoder hereinafter) 19 activates designated ones of bitlines, via the sense amplifiers 18, 18', corresponding to the current column address 118 input from the column address buffer 15. The sense amplifier 18, 18' operates in a manner known in the art to sense the data stored in the storage cells connected to the active wordline driven by the row decoder 16, 16'. The data controller 20 controls the data transfer where data are read through the bitlines activated by the column decoder 18, 18' and are delivered through the latch 21 during a read operation. The data input/output buffer 22 provides the read data bits to the data input/output pins DQ.

A valid WRITE command is initiated by the command decoder 12 when the /CS, /CAS, and /WE signals are low and when the /RAS signal is high on the rising edge of the internal CLK signal 110. During WRITE command operations, data are transferred according to a reverse way of the read operation. Descriptions about other commands, such as a PRECHAGE command, a AUTO REFRESH command, a SELF-REFRESH command, a BURST TERMINATION command, and SET MODE REGISTER command, are omitted for the sake of clarity.

Now, detail descriptions will be made about the booting circuit 23 with reference to FIGS. 2 through 5.

As mentioned above, the control logic 13 issues an internal /RAS signal corresponding to the /RAS signal. The booting circuit 23 is coupled to the control logic 13 and receives the internal /RAS signal 111. In normal, the booting circuit 23 produces as a booted voltage signal 130 a voltage which is booted to the selection level voltage that is a voltage necessary for the row decoder 16, 16' to drive the wordline. Detecting the internal /RAS signal starting to turn on, the booting circuit 23 further boots the booted voltage signal 130 above the selection level voltage. The further booted voltage signal 130 is delivered into the row decoder 16, 16'. The row decoder 16, 16' is coupled to the control logic 13 and the booting circuit 23 and connected to the wordlines. The row decoder 16, 16' starts to activate or drive a selected one of the wordlines with the booted voltage signal 130, in response to the internal /RAS signal turning on. However, the predetermined time interval passes to the drive of the selected wordline from the issue of the internal /RAS signal starting to turn on, depending on a circuit layout of the memory device, skews and so on. The booted voltage signal 130 used in the driving of the selected wordline is higher than the selection level voltage. Therefore, the probability that the booted voltage signal 130 falls below the selection level voltage is decreased, if falling below the selection level voltage, a recovery of the booted voltage signal 130 to the selection level voltage is quickly achieved.

Figure 2:
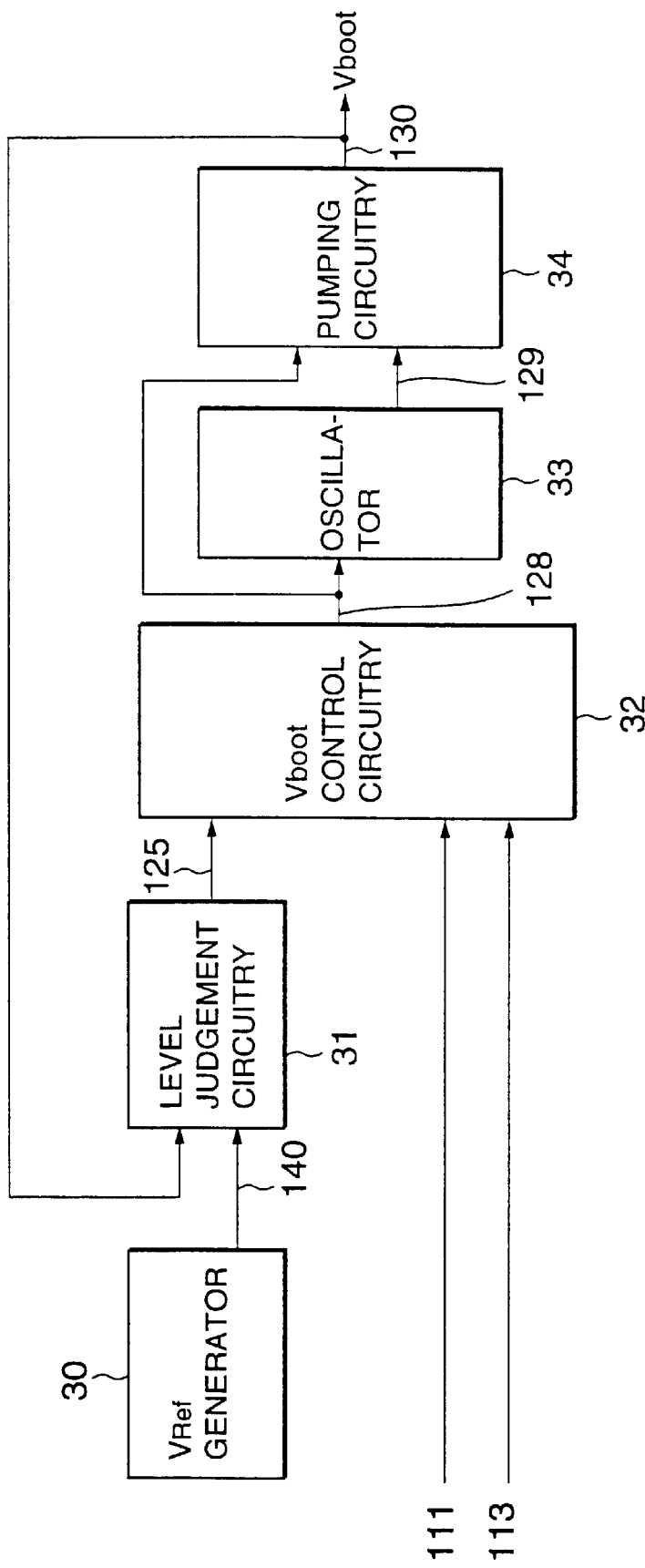
FIG. 2 is a block diagram of the booting circuit illustrated in FIG. 1.

As shown in FIG. 2, the booting circuit 23 comprises a reference voltage ($V_{Ref}$) generator 30, a level judgement circuitry 31, a booted voltage ($V_{boot}$) control circuitry 32, an oscillator 33, and a pumping circuitry 34. The reference voltage generator 30 generates a reference voltage signal 140.

The level judgement circuitry 31 receives the reference voltage signal 140, while monitoring the booted voltage signal 130. The level judgement circuitry 31 judges whether or not the booted voltage signal ($V_{boot}$) is lower than the selection level voltage (for example, 4.5 V) on the basis of the reference voltage signal $V_{Ref}$. The judgement result is produced as a result signal 125 by the level judgement circuitry 31. The result signal 125 is in ON state if the booted voltage signal 130 is lower than the selection level voltage.

Figure 3:
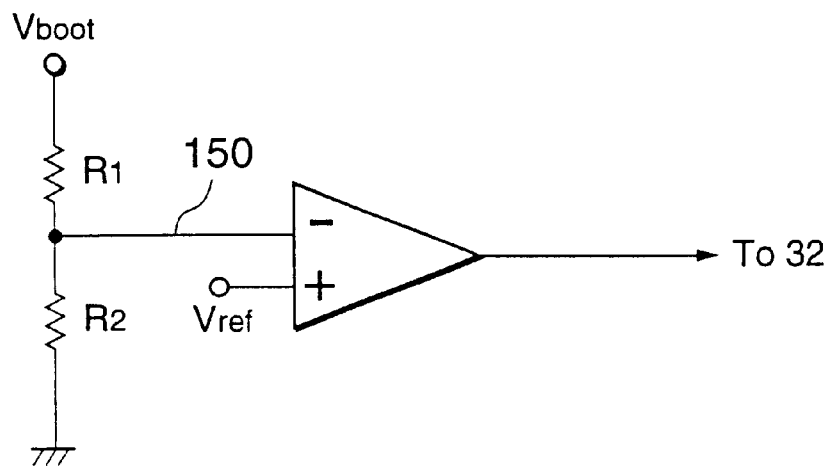
FIG. 3 is a circuit diagram of the level judgment circuitry shown in FIG. 2.

In this embodiment the level judgement circuitry 31 comprises a voltage divider consisting of two resistors R1 and R2, and a voltage comparator, as shown in FIG. 3. The voltage divider divides the booted voltage signal ($V_{boot}$) and produce a divided voltage signal 150. In this embodiment, the divided voltage signal 150 substantially has the same voltage level as the reference voltage signal $V_{Ref}$ 140 if the booted voltage signal $V_{boot}$ has the same voltage level of the selection level voltage. In other words, the reference voltage signal $V_{Ref}$ 140 is determined so as to be substantially equal to the divided voltage signal which corresponds to the booted voltage signal 130 equal to the selection level voltage.

The voltage comparator is coupled to the voltage divider and the reference voltage generator 30, and receives the reference voltage signal 140 and the divided signal 150. The voltage comparator compares the divided voltage signal 150 with the reference voltage signal 140 to produce an comparison output as the result signal 125. That is, the voltage comparator produces the result signal of ON state if the divided voltage signal 150 is lower than the reference voltage signal 140.

Turning to FIG. 2, the result signal 125 is supplied to the booted voltage control circuitry 32. The booted voltage control circuitry 32 also receives the internal /RAS signal 111 and the sense enable end signal (SEEND) 113, and produces a control signal 128. On producing of the control signal 128, the booted voltage control circuitry 32 judges first and second conditions. The first condition is that the internal /RAS signal 111 is in ON state (low) and the sense enable end signal 113 is in OFF state (low), while the second condition is that the result signal 125 is in ON state (high). In the case where at least one of first and second conditions is met, the booted voltage control circuitry 32 puts the control signal 128 in ON state (high).

Figure 4:
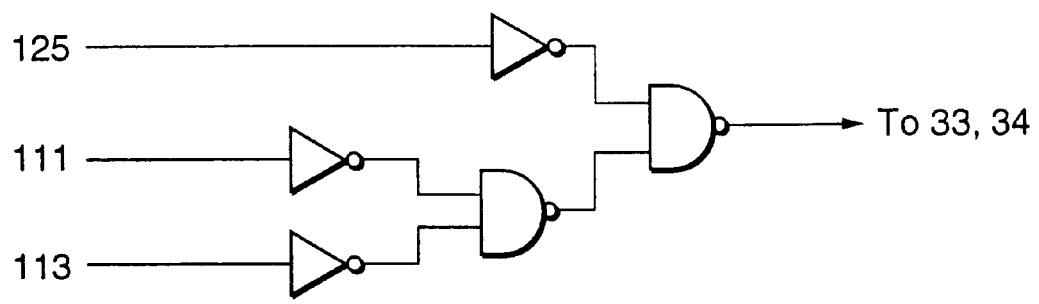
FIG. 4 is a circuit diagram of the booted voltage control circuitry shown in FIG. 2.

Referring to FIG. 4, the booted voltage control circuitry 32 comprises first through third inverters and first and second NAND gates. The first through third inverters receive the internal /RAS signal 111, the sense enable end signal 113 and the result signal 125, and produces first through third inverted outputs, respectively. The first NAND gate receives the first and the second inverted outputs, and produces a first NANDed output. The second NAND gate receives the third inverted output and the first NANDed output, and produces a second NANDed output as the control signal 128 which is in ON state when being high.

Boolean operation table of the booted voltage control circuitry 32 depicted in FIG. 4 is shown below.

| Internal/RAS (111) | SEEND (113) | Result (125) | Control (128) |
| --- | --- | --- | --- |
| 0 | 0 | 0 | 1 |
| 0 | 0 | 1 | 1 |
| 0 | 1 | 0 | 0 |
| 0 | 1 | 1 | 1 |
| 1 | 0 | 0 | 0 |
| 1 | 0 | 1 | 1 |
| 1 | 1 | 0 | 0 |
| 1 | 1 | 1 | 1 |

Referring to the above-depicted table, the control signal 128 is "1" when both of the internal /RAS signal 11 1 and the sense enable end signal 113 are "0", when the result signal 125 is "1", or when both of the internal /RAS signal 111 and the sense enable end signal 113 are "0" and the result signal 125 is "1." That is, the booted voltage control circuitry 32 produces the control signal 128 of "1", in the case where at least one of first and second conditions is met, as mentioned above.

Turning to FIG. 2, the oscillator 33 is coupled to the booted voltage control circuitry 33 and receives the control signal 128 from the booted voltage control circuitry 32. When the control signal 128 is high (ON state), the oscillator 33 is activated and produces an oscillating output 129.

The pumping circuitry 34 is coupled to the booted voltage control circuitry 32, the oscillator 33, and the row decoder 16, 16', and receives the control signal 128 from the booted voltage control circuitry 32. When the control signal 128 is in ON state (high), the pumping circuitry 34 is activated and pumps the oscillating output 129 to produce the booted voltage signal.

Figure 5:
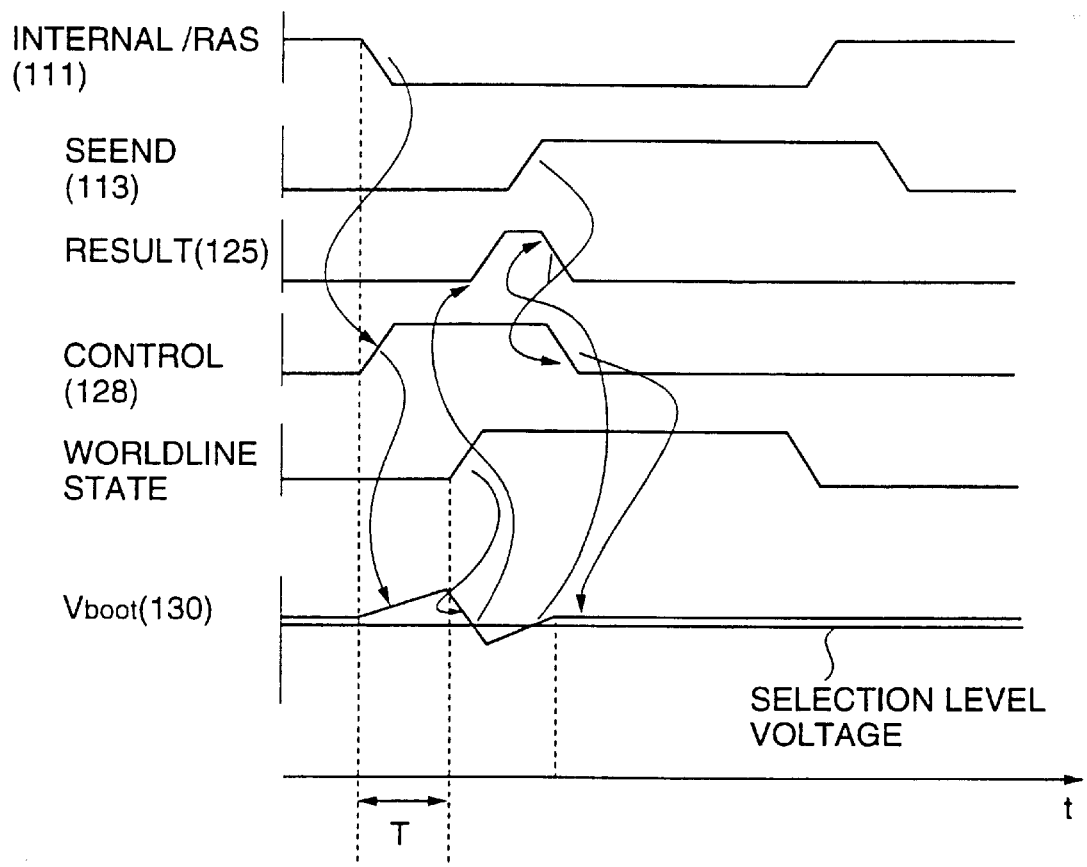
FIG. 5 is a timing chart illustrating transition of the booted voltage and the voltage control.

Referring to FIG. 5, the booted voltage signal 130 has the same level of the selection level voltage, in normal operation. When the internal /RAS signal 111 transitions from a logic high to a logic low, while the sense enable end signal 113 being kept in a logic low, the control signal 128 transitions from a logic low to a logic high. The transition from low to high results in the further booting of the booted voltage signal 130.

The predetermined time interval T passes from the further booting of the booted voltage signal 130, the wordline is activated by the row decoder and transitions from a logic low to a logic high, so that the booted voltage signal 130 is consumed in the driving and declines in voltage level as shown in FIG. 5.

When the booted voltage signal 130 falls below the selection level voltage, the result signal 125 transitions from a logic low to a logic high. However, the transition of the result signal 125 does not make an effect on the control signal 128, because both of the internal /RAS signal 111 and the sense enable end signal 113 are in logic low state.

When the booted voltage signal 130 recovers and reaches the selection level voltage, the result signal 125 transitions from a logic high to a logic low. At a similar time, the sense enable end signal 113 transitions from a logic low to a logic high, in this embodiment. Both of transitions make an effect on the control signal 128, resulting in the transition of the control signal 128 from a logic high to a logic low. The transition of the control signal 128 prevents the booted voltage signal 130 from being further booted, so that the booted voltage signal 130 is kept at the selection level voltage.

It is to be understood that the above description is intended to be illustrative and not restrictive. Many embodiments and the combinations thereof will be apparent to those of skill in the art upon reviewing the above description. For example, a memory device according to the above-mentioned embodiment is a SDRAM, but the present invention is not so limited. Those skilled in the art will recognize other equivalent of alternative memory device, such as a DRAM, or a EDO DRAM. In addition, a SDRAM of the above-mentioned embodiment comprises two banks, but the present invention is not so limited. For example, a SDRAM may comprise four banks, eight banks, or the like.

This application is based on Japanese Patent Application filed on Apr. 13, 2000, No. Hei 11-25310, which are incorporated herein by reference.

What is claimed is:

1. A memory device including:
    a memory cell array comprising storage cells, wordlines and bitlines, the storage cells being organized and connected to the wordlines and the bitlines in rows and columns;
    a control logic, responsive to a /RAS signal input to the memory device, for issuing an internal /RAS signal;
    a booting circuit, coupled to the control logic, for producing, as a booted voltage signal, a voltage which is booted to a selection level voltage in normal and which is further booted above the selection level voltage when the internal /RAS signal starts to turn on, the selection level voltage being a voltage necessary to drive the wordline;
    a row decoder, coupled to the control logic and the booting circuit and connected to the wordlines, for starting to drive a selected one of the wordlines with the booted voltage signal when a predetermined time interval passes since the internal /RAS signal starts to turn on.

2. A memory device as claimed in claim 1, wherein:
    the predetermined time interval depends on a circuit layout of the memory device.

3. A memory device as claimed in claim 1, further comprising a sense amplifier connected to the bitlines, wherein the control logic further issues a sense enable end signal which, when being in ON state, indicates a sufficient amplifying is executed at the sense amplifier.

4. A memory device as claimed in claim 3, wherein the booting circuit comprises:
    a reference voltage generator adapted to generate a reference voltage signal;
    a level judgement circuitry, responsive to the booted voltage signal and the reference voltage signal, for judging whether or not the booted voltage signal is lower than the selection level voltage on the basis of the reference voltage signal and for producing a result signal which is in ON state if the booted voltage signal is lower than the selection level voltage;
    a booted voltage control circuitry, responsive to the result signal, the internal /RAS signal and the sense enable end signal, for producing a control signal which is in ON state when at least one of first and second conditions is met, the first condition being that the internal /RAS signal is in ON state and the sense enable end signal is not in ON state, the second condition being that the result signal is in ON state;
    an oscillator, coupled to the booted voltage control circuitry, for producing an oscillating output when the control signal is in ON state; and
    a pumping circuitry, coupled to the booted voltage control circuitry, the oscillator, and the row decoder, for pumping the oscillating output to produce the booted voltage signal above the selection level voltage, when the control signal is in ON state.

5. A memory device as claimed in claim 4, wherein:
    the internal /RAS signal is in ON state when being low;
    the sense enable end signal is in ON state when being high;
    the result signal is in ON state when being high; and
    the booted voltage control circuitry comprises:
        first through third inverters, responsive to the internal /RAS signal, the sense enable end signal and the result signal, for producing first through third inverted outputs, respectively;
        a first NAND gate, responsive to the first and the second inverted outputs, for producing a first NANDed output; and
        a second NAND gate, responsive to the third inverted output and the first NANDed output, for producing a second NANDed output as the control signal which is in ON state when being high.

6. A memory device as claimed in claim 4, wherein the level judgement circuitry comprises:
    a voltage divider for dividing the booted voltage signal to produce a divided voltage signal which substantially has the same voltage level as the reference voltage signal if the booted voltage signal has the same voltage level of the selection level voltage; and
    a voltage comparator, coupled to the voltage divider and the reference voltage generator, for compare the divided voltage signal with the reference voltage signal to produce an comparison output as the result signal, so that the result signal is in ON state if the divided voltage signal is lower than the reference voltage signal.

7. In a memory device comprising a row decoder, a control logic, and a booting circuit, a method of supplying the row decoder with a voltage produced by the booting circuit, the control logic issuing an internal /RAS signal in response to a /RAS signal input to the memory device, the method being executed by the booting circuit and comprising:
    producing as a booted voltage signal a voltage which is booted to a selection level voltage in normal; and
    detecting the internal /RAS signal starting to turn on, so as to further boot the booted voltage signal above the selection level voltage.

8. A supplying method as claimed in claim 7, further comprising:
    monitoring the booted voltage signal; and
    booting the booted voltage signal to the selection level voltage when the booted voltage signal falls below the selection level voltage.

* * * * *